United States Patent
Lee

(10) Patent No.: US 8,877,300 B2
(45) Date of Patent: Nov. 4, 2014

(54) ATOMIC LAYER DEPOSITION USING RADICALS OF GAS MIXTURE

(75) Inventor: Sang In Lee, Sunnyvale, CA (US)

(73) Assignee: Veeco ALD Inc., Fremont, CA (US)

( * ) Notice: Subject to any disclaimer, the term of this patent is extended or adjusted under 35 U.S.C. 154(b) by 0 days.

(21) Appl. No.: 13/369,717

(22) Filed: Feb. 9, 2012

(65) Prior Publication Data

US 2012/0207948 A1    Aug. 16, 2012

Related U.S. Application Data

(60) Provisional application No. 61/443,556, filed on Feb. 16, 2011.

(51) Int. Cl.
| | | |
|---|---|---|
| *C23C 16/455* | (2006.01) | |
| *C23C 16/50* | (2006.01) | |
| *C23C 16/30* | (2006.01) | |
| *C23C 16/40* | (2006.01) | |

(52) U.S. Cl.
CPC ............. *C23C 16/308* (2013.01); *C23C 16/403* (2013.01); *C23C 16/405* (2013.01); *C23C 16/45551* (2013.01); *C23C 16/45542* (2013.01)
USPC ............................ 427/562; 427/569; 427/576

(58) Field of Classification Search
CPC ...... C23C 16/455; C23C 16/50; C23C 16/308
USPC ................ 427/569, 576, 255.29, 255.34, 562
See application file for complete search history.

(56) References Cited

U.S. PATENT DOCUMENTS

| | | | |
|---|---|---|---|
| 3,896,244 | A | 7/1975 | Ellis et al. |
| 4,891,247 | A | 1/1990 | Shamshoian |
| 5,120,568 | A | 6/1992 | Schuurmans et al. |
| 5,286,295 | A | 2/1994 | Sauvinet et al. |
| 5,300,189 | A | 4/1994 | Kokaku et al. |
| 5,368,897 | A | 11/1994 | Kurihara et al. |
| 5,549,780 | A | 8/1996 | Koinuma et al. |
| 5,560,777 | A | 10/1996 | Ahn |
| 5,565,249 | A | 10/1996 | Kurihara et al. |

(Continued)

FOREIGN PATENT DOCUMENTS

| | | |
|---|---|---|
| CN | 1436602 A | 8/2003 |
| EP | 0188208 A2 | 7/1986 |

(Continued)

OTHER PUBLICATIONS

Zhu, Ming, et al., "Aluminum oxynitride interfacial passivation layer for high-permittivity gate dielectric stack on gallium arsenide". Applied Physics Letters, 89, 202903 (2006) pp. 1-3.*

(Continued)

*Primary Examiner* — Bret Chen
(74) *Attorney, Agent, or Firm* — Fenwick & West LLP

(57) ABSTRACT

Performing atomic layer deposition (ALD) using radicals of a mixture of nitrogen compounds to increase the deposition rate of a layer deposited on a substrate. A mixture of nitrogen compound gases is injected into a radical reactor. Plasma of the compound gas is generated by applying voltage across two electrodes in the radical reactor to generate radicals of the nitrogen compound gases. The radicals are injected onto the surface of a substrate previously injected with source precursor. The radicals function as a reactant precursor and deposit a layer of material on the substrate.

9 Claims, 6 Drawing Sheets

(56) References Cited

U.S. PATENT DOCUMENTS

| | | | |
|---|---|---|---|
| 5,578,130 A | 11/1996 | Hayashi et al. | |
| 5,665,640 A | 9/1997 | Foster et al. | |
| 5,711,814 A | 1/1998 | Mori | |
| 5,820,947 A | 10/1998 | Itoh | |
| 5,863,337 A | 1/1999 | Neuman et al. | |
| 5,879,459 A | 3/1999 | Gadgil et al. | |
| 5,951,771 A | 9/1999 | Raney et al. | |
| 6,051,150 A | 4/2000 | Miyakawa | |
| 6,079,353 A | 6/2000 | Leksell et al. | |
| 6,099,974 A | 8/2000 | Lenling | |
| 6,143,077 A | 11/2000 | Ikeda et al. | |
| 6,319,615 B1 | 11/2001 | Jansen | |
| 6,354,109 B1 | 3/2002 | Boire et al. | |
| 6,406,590 B1 | 6/2002 | Ebata et al. | |
| 6,416,822 B1 | 7/2002 | Chiang et al. | |
| 6,424,091 B1 | 7/2002 | Sawada et al. | |
| 6,435,428 B2 | 8/2002 | Kim et al. | |
| 6,521,048 B2 | 2/2003 | Miller et al. | |
| 6,641,673 B2 | 11/2003 | Yang | |
| 6,656,831 B1 | 12/2003 | Lee et al. | |
| 6,730,614 B1 | 5/2004 | Lim et al. | |
| 6,824,816 B2 | 11/2004 | Aaltonen et al. | |
| 6,926,572 B2 | 8/2005 | Park et al. | |
| 6,972,055 B2 | 12/2005 | Sferlazzo | |
| 6,997,371 B2 | 2/2006 | Shabtay | |
| 7,118,779 B2 | 10/2006 | Verghese et al. | |
| 7,361,548 B2* | 4/2008 | Lim et al. | 438/253 |
| 7,494,545 B2 | 2/2009 | Lam et al. | |
| 7,754,013 B2 | 7/2010 | Granneman | |
| 7,886,688 B2 | 2/2011 | Takeuchi et al. | |
| 7,914,847 B2 | 3/2011 | Verghese et al. | |
| 7,943,527 B2 | 5/2011 | Kumar et al. | |
| 7,981,472 B2 | 7/2011 | Dalton et al. | |
| 8,257,799 B2 | 9/2012 | Lee | |
| 8,328,982 B1 | 12/2012 | Babayan et al. | |
| 2001/0047759 A1 | 12/2001 | Matsui et al. | |
| 2002/0092616 A1 | 7/2002 | Kim | |
| 2002/0100418 A1 | 8/2002 | Sandhu et al. | |
| 2002/0112819 A1 | 8/2002 | Kamarehi et al. | |
| 2002/0197864 A1 | 12/2002 | Sneh | |
| 2003/0049375 A1 | 3/2003 | Nguyen et al. | |
| 2003/0072881 A1 | 4/2003 | Yang et al. | |
| 2003/0143328 A1 | 7/2003 | Chen et al. | |
| 2003/0207593 A1 | 11/2003 | Derderian et al. | |
| 2003/0214043 A1* | 11/2003 | Saitoh et al. | 257/758 |
| 2004/0009307 A1* | 1/2004 | Koh et al. | 427/569 |
| 2004/0052972 A1 | 3/2004 | Schmitt | |
| 2004/0067641 A1 | 4/2004 | Yudovsky | |
| 2004/0083967 A1 | 5/2004 | Yuda et al. | |
| 2004/0129212 A1 | 7/2004 | Gadgil et al. | |
| 2004/0171280 A1 | 9/2004 | Conley et al. | |
| 2004/0224527 A1 | 11/2004 | Sarigiannis et al. | |
| 2004/0247787 A1 | 12/2004 | Mackie et al. | |
| 2004/0261946 A1 | 12/2004 | Endoh et al. | |
| 2005/0016457 A1 | 1/2005 | Kawasaki et al. | |
| 2005/0064207 A1* | 3/2005 | Senzaki et al. | 428/446 |
| 2005/0064236 A1 | 3/2005 | Lim et al. | |
| 2005/0106094 A1 | 5/2005 | Kondo | |
| 2005/0183768 A1 | 8/2005 | Roscheisen et al. | |
| 2006/0019033 A1* | 1/2006 | Muthukrishnan et al. | 427/248.1 |
| 2006/0068519 A1 | 3/2006 | Dunbar et al. | |
| 2006/0072281 A1* | 4/2006 | Nam et al. | 361/311 |
| 2006/0183301 A1 | 8/2006 | Yeom et al. | |
| 2006/0211243 A1 | 9/2006 | Ishizaka et al. | |
| 2006/0213441 A1 | 9/2006 | Kobrin et al. | |
| 2006/0237399 A1 | 10/2006 | Horner-Richardson et al. | |
| 2006/0240665 A1 | 10/2006 | Kang et al. | |
| 2007/0082500 A1* | 4/2007 | Norman et al. | 438/758 |
| 2007/0145023 A1 | 6/2007 | Holber et al. | |
| 2007/0224348 A1 | 9/2007 | Dickey et al. | |
| 2007/0237699 A1* | 10/2007 | Clark | 423/263 |
| 2007/0243325 A1 | 10/2007 | Sneh | |
| 2007/0264488 A1 | 11/2007 | Lee | |
| 2007/0281082 A1 | 12/2007 | Mokhlesi et al. | |
| 2007/0281089 A1 | 12/2007 | Heller et al. | |
| 2008/0026162 A1 | 1/2008 | Dickey et al. | |
| 2008/0075881 A1 | 3/2008 | Won et al. | |
| 2008/0092953 A1 | 4/2008 | Lee | |
| 2008/0106202 A1 | 5/2008 | Du et al. | |
| 2008/0206967 A1* | 8/2008 | Miyairi et al. | 438/479 |
| 2008/0241387 A1 | 10/2008 | Keto | |
| 2008/0260963 A1 | 10/2008 | Yoon et al. | |
| 2009/0017190 A1 | 1/2009 | Sferlazzo et al. | |
| 2009/0044661 A1 | 2/2009 | Li et al. | |
| 2009/0068849 A1 | 3/2009 | Endo et al. | |
| 2009/0102385 A1 | 4/2009 | Wi | |
| 2009/0130858 A1 | 5/2009 | Levy | |
| 2009/0133714 A1 | 5/2009 | Yamazaki et al. | |
| 2009/0165715 A1 | 7/2009 | Oh | |
| 2009/0170345 A1* | 7/2009 | Akae et al. | 438/786 |
| 2009/0197406 A1 | 8/2009 | Cao et al. | |
| 2009/0202817 A1 | 8/2009 | Durandeau et al. | |
| 2009/0286381 A1* | 11/2009 | van Schravendijk et al. | 438/435 |
| 2009/0291211 A1 | 11/2009 | Ryu et al. | |
| 2010/0037820 A1 | 2/2010 | Lee | |
| 2010/0037824 A1 | 2/2010 | Lee | |
| 2010/0055347 A1 | 3/2010 | Kato et al. | |
| 2010/0064971 A1 | 3/2010 | Lee | |
| 2010/0068413 A1 | 3/2010 | Lee | |
| 2010/0124618 A1 | 5/2010 | Kobayashi et al. | |
| 2010/0181566 A1 | 7/2010 | Lee | |
| 2010/0189900 A1 | 7/2010 | Dickey et al. | |
| 2010/0215871 A1 | 8/2010 | Lee | |
| 2010/0255625 A1* | 10/2010 | De Vries | 438/57 |
| 2010/0304047 A1* | 12/2010 | Yang et al. | 427/577 |
| 2010/0310771 A1 | 12/2010 | Lee | |
| 2011/0017997 A1* | 1/2011 | Kamath et al. | 257/66 |
| 2011/0070380 A1 | 3/2011 | Shero et al. | |
| 2012/0021252 A1 | 1/2012 | Lee | |
| 2012/0094149 A1 | 4/2012 | Lee | |
| 2012/0114877 A1 | 5/2012 | Lee | |
| 2012/0125258 A1 | 5/2012 | Lee | |
| 2012/0213945 A1* | 8/2012 | Lee | 427/563 |
| 2012/0225204 A1 | 9/2012 | Yudovsky | |
| 2012/0301632 A1 | 11/2012 | Lee | |

FOREIGN PATENT DOCUMENTS

| | | |
|---|---|---|
| EP | 0499524 A1 | 2/1992 |
| FR | 2736632 A1 | 1/1997 |
| JP | S62-081018 A | 4/1987 |
| JP | H01-096924 A | 4/1989 |
| JP | 1-161835 A | 6/1989 |
| JP | H01-223724 A | 9/1989 |
| JP | H2-187018 A | 7/1990 |
| JP | H04-092414 A | 3/1992 |
| JP | H09-064000 A | 3/1997 |
| JP | 09-167757 A | 6/1997 |
| JP | 09-199738 A | 7/1997 |
| JP | 11-092943 A | 4/1999 |
| JP | 2001-357780 A | 12/2001 |
| JP | 2002-018276 A | 1/2002 |
| JP | 2003-049272 A | 2/2003 |
| JP | 2003-073835 A | 3/2003 |
| JP | 2003-174019 A | 6/2003 |
| JP | 2003-324070 | 11/2003 |
| JP | 2004-010949 A | 1/2004 |
| JP | 2004-091837 A | 3/2004 |
| JP | 2005-089781 A | 4/2005 |
| JP | 2005-116898 | 4/2005 |
| JP | 2005-347245 A | 5/2005 |
| JP | 2006-236697 A | 9/2006 |
| JP | 2007-019460 A | 1/2007 |
| JP | 2007-191792 | 8/2007 |
| JP | 2007-266093 A | 10/2007 |
| JP | 2008-108895 A | 5/2008 |
| KR | 100175011 B1 | 11/1998 |
| KR | 10-2001-0040561 | 5/2001 |
| KR | 10-2002-0078804 | 10/2002 |
| KR | 10-2002-0083564 A | 11/2002 |
| KR | 10-0631972 | 8/2003 |
| KR | 10-2004-0042209 A | 5/2004 |
| KR | 10-2005-0015931 A | 2/2005 |
| KR | 10-0542736 | 1/2006 |

(56) References Cited

FOREIGN PATENT DOCUMENTS

| | | |
|---|---|---|
| KR | 10-2006-0117607 | 11/2006 |
| KR | 10-0673211 B1 | 1/2007 |
| KR | 10-2007-0051332 | 5/2007 |
| KR | 10-2007-0076955 A | 7/2007 |
| KR | 10-2007-0096770 A | 10/2007 |
| KR | 10-2007-0101127 A | 10/2007 |
| KR | 10-2007-0101360 A | 10/2007 |
| KR | 10-0771926 A | 10/2007 |
| KR | 10-2008-0067042 A | 7/2008 |
| WO | WO 2006/054854 A1 | 5/2006 |
| WO | WO 2007/134322 A2 | 11/2007 |
| WO | WO 2007/144536 A1 | 12/2007 |
| WO | WO 2008/130369 A1 | 10/2008 |
| WO | WO 2009/031886 * | 3/2009 |
| WO | WO 2010/138102 A1 | 12/2010 |

OTHER PUBLICATIONS

He, Gang, et al., "Metal-organic chemical vapor deposition of aluminum oxynitride from propylamine-dimethylaluminum hydride and oxygen: growth mode dependence and performance optimization." Journal of Materials Chemistry, 2012, 22, 7468-7477.*

Bosund, Markus, et al., "Properties of AlN grown by plasma enhanced atomic layer deposition". Applied Surface Science 257 (2011) 7827-7830.*

Eom, Dail, et al., "Properties of Aluminum Nitride Thin Films Deposited by an Alternate Injection of Trimethylaluminum and Ammonia under Ultraviolet Radiation". Journal of the Electrochemical Society, 153 (4) C229-C234 (2006).*

Dameron, A.A. et al., "Molecular Layer Deposition of Alucone Polymer Films Using Trimethylaluminum and Ethylene Glycol," Chem. Mater., 2008, pp. 3315-3326, vol. 20.

PCT Written Opinion, PCT Application No. PCT/KR2010/001076, Sep. 27, 2010, 8 pages.

PCT International Search Report and Written Opinion, PCT Application No. PCT/US11/44470, Dec. 7, 2011, 13 pages.

PCT International Search Report and Written Opinion, PCT Application No. PCT/US2011/056285, Mar. 8, 2012, 11 pages.

PCT International Search Report and Written Opinion, PCT Application No. PCT/US11/58552, Mar. 14, 2012, 12 pages.

PCT International Search Report and Written Opinion, PCT Application No. PCT/US2011/060474, Mar. 22, 2012, 12 pages.

PCT Invitation to Pay Additional Fees, PCT Application No. PCT/US12/25095, May 22, 2012, 2 pages.

PCT International Search Report and Written Opinion, PCT Application No. PCT/US12/25483, May 29, 2012, 10 pages.

U.S. Appl. No. 13/185,793, filed Jul. 19, 2011, Inventor: Sang In Lee.

U.S. Appl. No. 13/273,076, filed Oct. 13, 2011, Inventor: San In Lee.

U.S. Appl. No. 13/285,417, filed Oct. 31, 2011, Inventor: Sang In Lee.

U.S. Appl. No. 13/295,012, filed Nov. 11, 2011, Inventor: Sang In Lee.

U.S. Appl. No. 13/397,590, filed Feb. 15, 2012, Inventor: Sang In Lee.

PCT International Search Report and Written Opinion, PCT Application No. PCT/US12/25095, Aug. 3, 2012. 18 pages.

European Extended Search Report, European Application No. 10786646.9, Nov. 29, 2012, 17 pages.

Choi, J. M. et al., "Ultraviolet Enhanced Si-Photodetector Using p-NiO Films," Applied Surface Science, May 15, 2005, pp. 435-438, vol. 244, No. 1-4.

European Extended Search Report, European Application No. 10733634.9, Jan. 30, 2013, 5 pages.

Hermle, M. et al., "Analyzing the Effects of Front-Surface Fields on Back-Junction Silicon Solar Cells Using the Charge-Collection Probability and the Reciprocity Theorem," Journal of Applied Physics, Mar. 10, 2008, 7 pages, vol. 103, No. 5.

Kymakis, E. et al., "Bi-Layer Photovoltaic Devices with PPQ as the Electron Acceptor Layer," Solar Engergy Materials & Solar Cells, Jul. 24, 2006, pp. 1705-1714, vol. 90, No. 12.

Verlinden, P. et al., "Measurement of Diffusion Length and Surface Recombination Velocity in Interdigitated Back Contact (IBC) and Front Surface Field (FSF) Solar Cells," Physica, 1985, pp. 317-321, vol. 129, No. 1-3.

Yoshikawa. O. et al., "Enhanced Efficiency and Stability in P3HT:PCBM Bulk Heterojunction Solar Cell by Using TiO2 Hole Blocking Layer," Mater. Res. Soc. Symp. Proc., Materials Research Society, Jan. 2007 , 6 pages.

Chinese First Office Action, Chinese Application No. 201080025311.3, Jun. 25, 2013, 14 pages.

Japanese First Office Action, Japanese Application No. 2012-514229, Jul. 17, 2013, 8 pages.

Taiwan Office Action, Taiwan Application No. 101105141, Nov. 25, 2013, 11 pages.

Taiwan Office Action, Taiwan Application No. 101105355, Dec. 30, 2013, 13 pages.

European Examination Report, European Patent Application No. 10786646.9, Oct. 24, 2013, 5 pages.

Maydannik, P.S. et al., "An Atomic Layer Deposition Process for Moving Flexible Subtrates,"Chemical Engineering Journal, 2011, pp. 345-349, vol. 171.

Taiwan Office Action, Taiwan Application No. 100126066, Oct. 8, 2013, 14 pages.

* cited by examiner

ATOMIC LAYER DEPOSITION USING RADICALS OF GAS MIXTURE

CROSS-REFERENCE TO RELATED APPLICATION

This application claims priority under 35 U.S.C. §119(e) to U.S. Provisional Patent Application No. 61/443,556, filed on Feb. 16, 2011, which is incorporated by reference herein in its entirety.

BACKGROUND

1. Field of Art

The present invention relates to depositing one or more layers of materials on a substrate using atomic layer deposition (ALD).

2. Description of the Related Art

An atomic layer deposition (ALD) is a thin film deposition technique for depositing one or more layers of material on a substrate. ALD uses two types of chemical, one is a source precursor and the other is a reactant precursor. Generally, ALD includes four stages: (i) injection of a source precursor, (ii) removal of a physical adsorption layer of the source precursor, (iii) injection of a reactant precursor, and (iv) removal of a physical adsorption layer of the reactant precursor. ALD can be a slow process that can take an extended amount of time or many repetitions before a layer of desired thickness can be obtained. Hence, to expedite the process, a vapor deposition reactor with a unit module (so-called a linear injector), as described in U.S. Patent Application Publication No. 2009/0165715 or other similar devices may be used to expedite ALD process. The unit module includes an injection unit and an exhaust unit for a source material (a source module), and an injection unit and an exhaust unit for a reactant (a reactant module).

A conventional ALD vapor deposition chamber has one or more sets of reactors for depositing ALD layers on substrates. As the substrate passes below the reactors, the substrate is exposed to the source precursor, a purge gas and the reactant precursor. The source precursor molecules deposited on the substrate reacts with reactant precursor molecules or the source precursor molecules are replaced with the reactant precursor molecules to deposit a layer of material on the substrate. After exposing the substrate to the source precursor or the reactant precursor, the substrate may be exposed to the purge gas to remove excess source precursor molecules or reactant precursor molecules from the substrate.

To reduce the number of reiteration needed to deposit a material of a desired thickness, it is advantageous to increase the deposition rate per each ALD cycle.

SUMMARY

Embodiments relate to depositing a layer of material on a substrate by generating radicals of a gas mixture containing a first gas and a second gas and then injecting the radicals onto a substrate. The first gas includes a nitrogen compound. The substrate is previously injected with a source precursor. The radicals function as a reactant precursor reacting with or replacing source precursor molecules on the substrate and depositing a layer of material on the substrate.

In one embodiment, the second gas includes another nitrogen compound. The first gas may include $NH_3$ and the second gas may include $N_2O$.

In one embodiment, the deposited material comprises aluminum oxynitride (AlON).

In one embodiment, the ratio of $N_2O$ and $NH_3$ is 70:30 to 90:10. More preferably, the ratio of $N_2O$ and $NH_3$ is 80:20.

In one embodiment, the mixture of gases is injected into a plasma chamber in a radical reactor. A voltage is applied between a first electrode in the plasma chamber and a second electrode surrounding the plasma chamber to generate plasma in the plasma chamber. The plasma generates radicals of the mixture of gases.

In one embodiment, the distance from the plasma chamber to the substrate is less than 80 mm.

In one embodiment, the source precursor is selected from a group consisting of Tetraethylmethylaminozirconium (TEMAZr), Trimethylsilane (TMS), Tridimethylaminesilicone (3DMAS) and Tetraethylmethylaluminumtitanium (TEMATi).

In one embodiment, the first gas comprises $NH_3$ and the second gas comprises $CH_4$.

Embodiments also relate to a radical reactor comprising a body and an electrode to generate radicals functioning as a reactant precursor in an atomic layer deposition (ALD) process. The body is formed with a channel for supplying gas, a plasma chamber connected to the channel to receive the supplied gas and generate radicals of the supplied gas, a reaction chamber connected to the plasma chamber to receive the generated radicals and located above a substrate to expose the substrate to the radicals, and one or more exhaust portions to discharge excess gas and/or radicals. An electrode extends within the body. A voltage is applied across the electrode and the body to generate plasma in the plasma chamber.

DETAILED DESCRIPTION OF EMBODIMENTS

Figure 1:
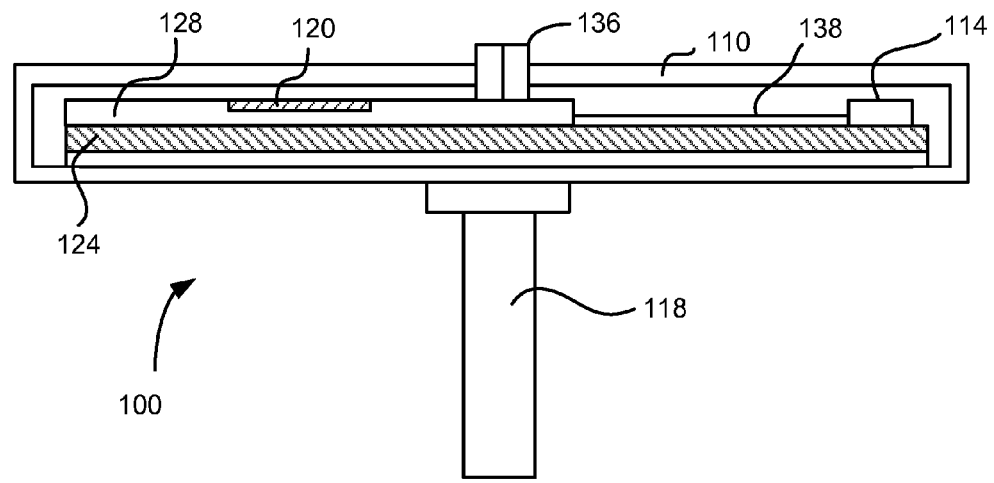
FIG. 1 is a cross sectional diagram of a linear deposition device, according to one embodiment.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments relate to performing atomic layer deposition (ALD) using a gas mixture to generate radicals that function as a reactant precursor for depositing a layer of material on a substrate. The gas mixture includes a nitrogen containing compound such as $NH_3$ or $N_2O$. The substrate is previously injected with a source precursor material. Hence, when the substrate is injected with the reactant precursor, a layer of material is deposited on the substrate. By using a mixture of gases instead of a single gas to generate radicals, the deposition rate of the material can be increased.

Figure 2:
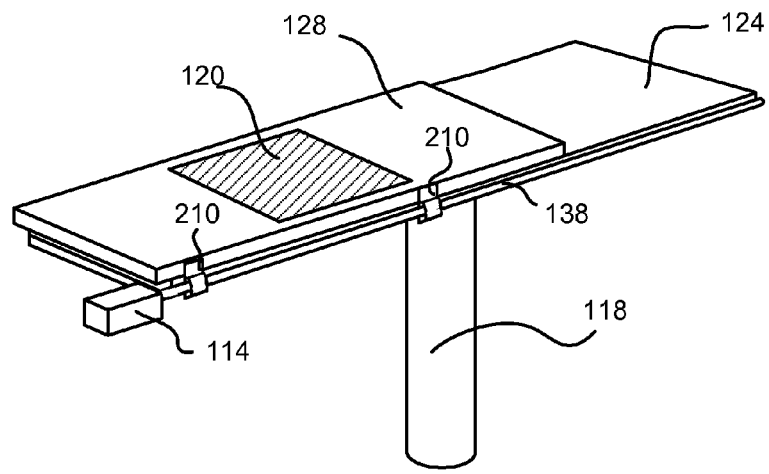
FIG. 2 is a perspective view of a linear deposition device, according to one embodiment.

FIG. 1 is a cross sectional diagram of a linear deposition device 100, according to one embodiment. FIG. 2 is a perspective view of the linear deposition device 100 (without chamber walls to facilitate explanation), according to one embodiment. The linear deposition device 100 may include, among other components, a support pillar 118, the process chamber 110 and one or more reactors 136. The reactors 136 may include one or more of injectors and radical reactors. Each of the injectors injects source precursors, reactant precursors, purge gases or a combination of these materials onto the substrate 120. As described below in detail with reference to FIG. 5, source precursors and/or reactant precursors may be radicals of a gas mixture.

The process chamber enclosed by the walls may be maintained in a vacuum state to prevent contaminants from affecting the deposition process. The process chamber 110 contains a susceptor 128 which receives a substrate 120. The susceptor 128 is placed on a support plate 124 for a sliding movement. The support plate 124 may include a temperature controller (e.g., a heater or a cooler) to control the temperature of the substrate 120. The linear deposition device 100 may also include lift pins (not shown) that facilitate loading of the substrate 120 onto the susceptor 128 or dismounting of the substrate 120 from the susceptor 128.

In one embodiment, the susceptor 128 is secured to brackets 210 that move across an extended bar 138 with screws formed thereon. The brackets 210 have corresponding screws formed in their holes receiving the extended bar 138. The extended bar 138 is secured to a spindle of a motor 114, and hence, the extended bar 138 rotates as the spindle of the motor 114 rotates. The rotation of the extended bar 138 causes the brackets 210 (and therefore the susceptor 128) to make a linear movement on the support plate 124. By controlling the speed and rotation direction of the motor 114, the speed and the direction of the linear movement of the susceptor 128 can be controlled. The use of a motor 114 and the extended bar 138 is merely an example of a mechanism for moving the susceptor 128. Various other ways of moving the susceptor 128 (e.g., use of gears and pinion at the bottom, top or side of the susceptor 128). Moreover, instead of moving the susceptor 128, the susceptor 128 may remain stationary and the reactors 136 may be moved.

Figure 3:
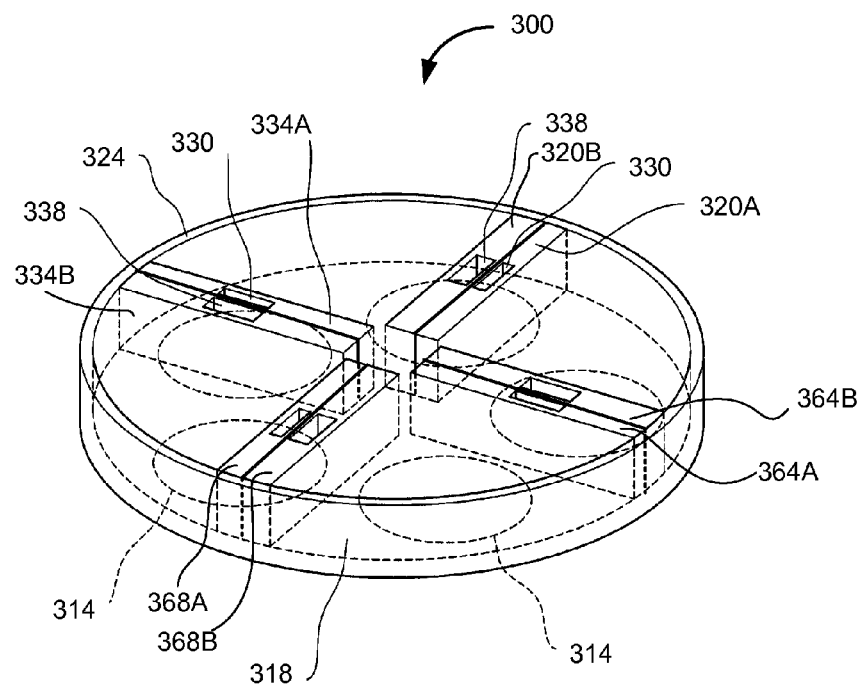
FIG. 3 is a perspective view of a rotating deposition device, according to one embodiment.

FIG. 3 is a perspective view of a rotating deposition device 300, according to one embodiment. Instead of using the linear deposition device 100 of FIG. 1, the rotating deposition device 300 may be used to perform the deposition process according to another embodiment. The rotating deposition device 300 may include, among other components, reactors 320A, 320B, 334A, 334B, 364A, 364B, 368A, 368B, a susceptor 318, and a container 324 enclosing these components. A set of reactors (e.g., 320A and 320B) of the rotating deposition device 300 correspond to the reactors 136 of the linear deposition device 100, as described above with reference to FIG. 1. The susceptor 318 secures the substrates 314 in place. The reactors 320A, 320B, 334A, 334B, 364A, 364B, 368A, 368B are placed above the substrates 314 and the susceptor 318. Either the susceptor 318 or the reactors 320, 334, 364, 368 rotate to subject the substrates 314 to different processes.

One or more of the reactors 320A, 320B, 334A, 334B, 364A, 364A, 368B, 368B are connected to gas pipes (not shown) to provide source precursor, reactor precursor, purge gas and/or other materials. The materials provided by the gas pipes may be (i) injected onto the substrate 314 directly by the reactors 320A, 320B, 334A, 334B, 364A, 364B, 368A, 368B, (ii) after mixing in a chamber inside the reactors 320A, 320B, 334A, 334B, 364A, 364B, 368A, 368B, or (iii) after conversion into radicals by plasma generated within the reactors 320A, 320B, 334A, 334B, 364A, 364B, 368A, 368B. After the materials are injected onto the substrate 314, the redundant materials may be exhausted through outlets 330, 338. The interior of the rotating deposition device 300 may also be maintained in a vacuum state.

Although following example embodiments are described primarily with reference to the reactors 136 in the linear deposition device 100, the same principle and operation can be applied to the rotating deposition device 300 or other types of deposition device.

Figure 4:
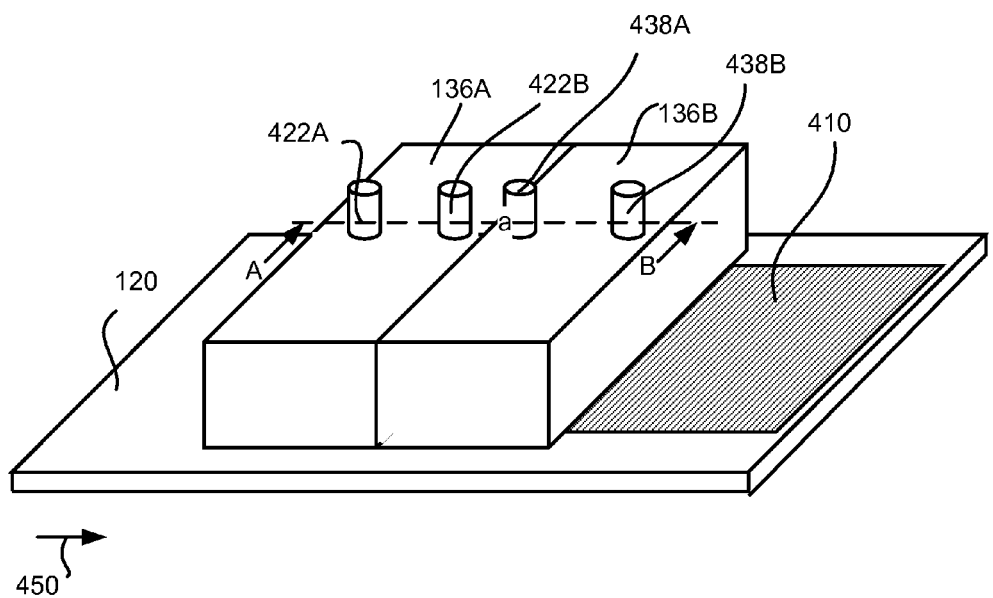
FIG. 4 is a perspective view of reactors in a deposition device, according to one embodiment.

FIG. 4 is a perspective view of reactors 136A, 136B (collectively referred to as the "reactors 136") in the deposition device 100 of FIG. 1, according to one embodiment. In FIG. 4, the reactors 136A and 136B are placed in tandem adjacent to each other. In other embodiments, the reactors 136A, 136B may be placed with a distance from each other. As the substrate 120 moves from the left to the right (as shown by arrow 450), the substrate 120 is sequentially injected with materials by the reactors 136A and 136B to form a deposition layer 410 on the substrate 120. Instead of moving the substrate 120, the reactors 136A, 136B may move from the right to the left while injecting the source precursor materials or the reactant precursor materials.

In one or more embodiments, the reactor 136A is a gas injector that injects source precursor materials onto the substrate 120. The reactor 136A is connected to a pipe (not shown) to receive the source precursor from a source (e.g., a canister). The source precursor is injected onto the substrate 120, forming one or more layers of source precursor molecules on the substrate 120. Excess source precursor molecules are exhausted via exhaust pipes 422A, 422B.

The reactor 136B may be a radical reactor that generates radicals of gas or a gas mixture received from one or more sources (e.g., canisters). The radicals of gas or gas mixture may function as reactant precursor that forms an atomic layer of materials on the substrate 120 in conjunction with the source precursor. The gas or gas mixtures are injected into the reactor 136B via a pipe (not shown), and are converted into radicals within the reactor 136B by applying voltage across electrodes. The radicals are injected onto the substrate 120, and remaining radicals and/or gas reverted to inactive state are discharged from the reactor 136B via exhaust pipes 438A, 438B.

Figure 5A:
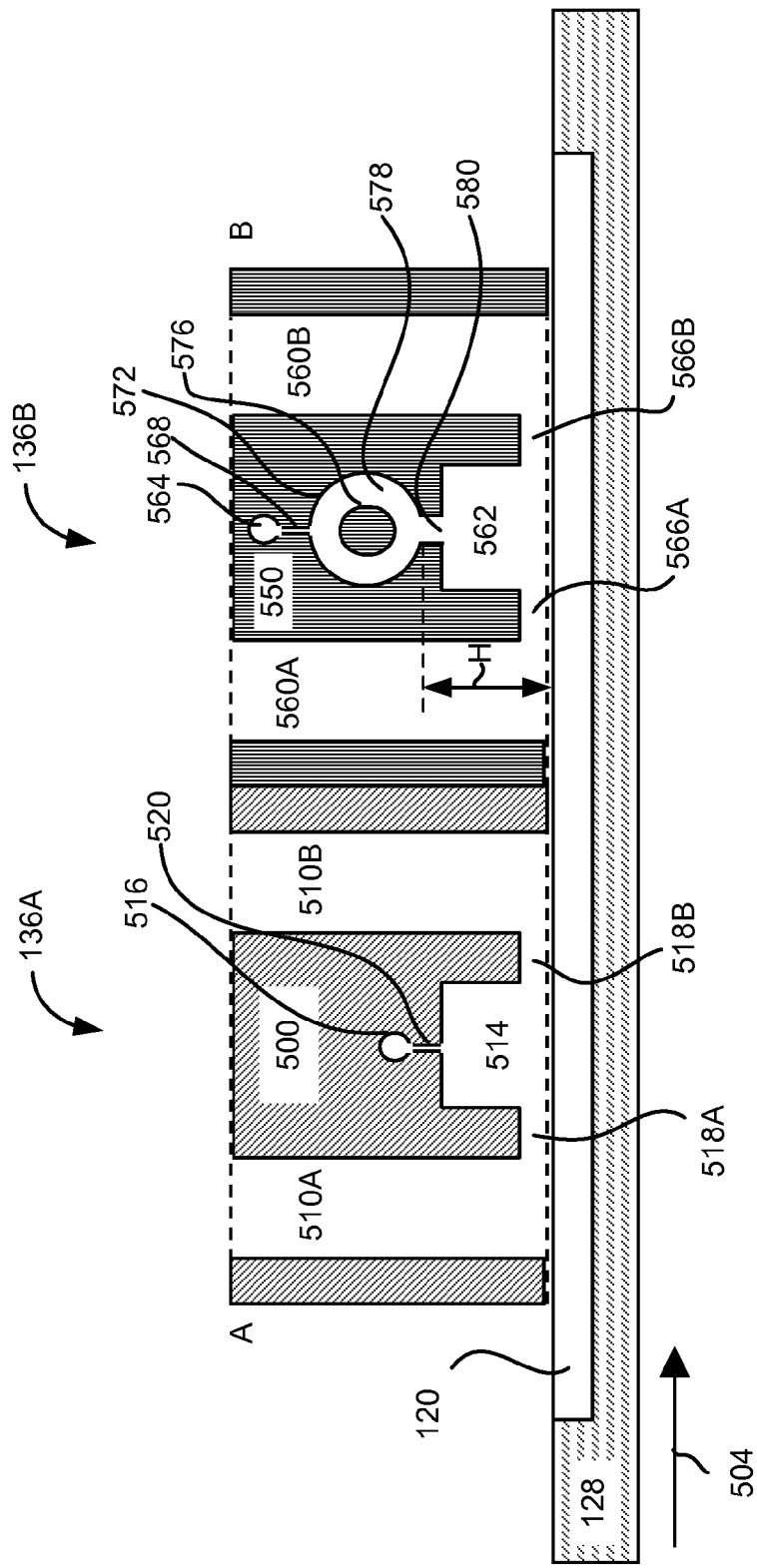
FIG. 5A is a cross sectional diagram illustrating the reactors taken along line A-B of FIG. 4, according to one embodiment.

FIG. 5A is a cross sectional diagram illustrating the reactors 136A, 136B taken along line A-B of FIG. 4, according to one embodiment. The injector 136A includes a body 500 formed with a gas channel 516, perforations (slits or holes) 520, a reaction chamber 514, constriction zones 518A, 518B, and exhaust portions 510A, 510B. The source precursor is injected into the reaction chamber 514 via the gas channel 516 and the perforations 520. The region of the substrate 120 below the reaction chamber 514 comes into contact with the source precursor and absorbs source precursor molecules on its surface. The excess source precursor (i.e., source precursor remaining after the source precursor is deposited on the substrate 120) passes through the constriction zones 518A, 518B, and are discharged via the exhaust portions 510A, 510B. The exhaust portions 510A, 510B are connected to the exhaust pipes 422A, 422B.

While the source precursor molecules pass the constriction zones 518A, 518B, physisorbed source precursor molecules are at least partially removed from the region of the substrate 120 below these zones 518A, 518B due to higher flow rate of the source precursor molecules.

In one or more embodiment, the injector 136A may also inject purge gas onto the substrate 120 to remove physisorbed source precursor molecules from the substrate 120, leaving only chemisorbed source precursor molecules on the substrate 120. In this way, an ALD process yielding a high quality atomic layer can be obtained.

The radical reactor 136B has a similar structure as the injector 136A except that the radical reactor further includes a plasma generator. The plasma generator includes an inner electrode 576 and an outer electrode 572 surrounding a plasma chamber 578 (the outer electrode 572 may be part of a metallic body 550). The body 550 is formed with, among others, a gas channel 564, perforations (slits or holes) 568, the plasma chamber 578, an injector slit 580, a reaction chamber 562 and exhaust portions 560A, 560B. A gas or a mixture of gases is injected via the channel 564 and perforations 568 into the plasma chamber 578. By applying a voltage difference between the inner electrode 576 and the outer electrode 572, plasma is generated in the plasma chamber 578. As a result of the plasma, radicals of the gas or the mixture of gases are generated within the plasma chamber 578. The generated radicals are injected into the reaction chamber 562 via the injector slit 580. The region of the substrate 120 below the reaction chamber 562 comes into contact with the radicals, forming the deposited layer 410 on the substrate 120.

The distance H between the plasma chamber 578 and the substrate 120 is configured so that a sufficient amount of radicals reach the substrate 120 in an active state. Radicals have a predetermined lifetime. Hence, as the radicals travel via the injector slit 580 and the reaction chamber 562 to the substrate 120, some of the radicals revert back to an inactive gaseous state. With the increase in the travel distance, the amount of radicals reverting to the inactive gaseous state increases. Hence, it is advantageous to set the distance H to be less than a certain length. For example, the distance H is set to 10 to 100 mm.

When using radicals of nitrogen containing gas mixtures (e.g., $N_2O$ and $NH_3$ mixture), the lifespan of the radicals is relatively short and most of the radicals revert back to an inactive state if the distance H is 80 mm or more. Hence, the distance H is set to be less than 80 mm when using radicals of nitrogen containing gas mixtures.

Figure 5B:
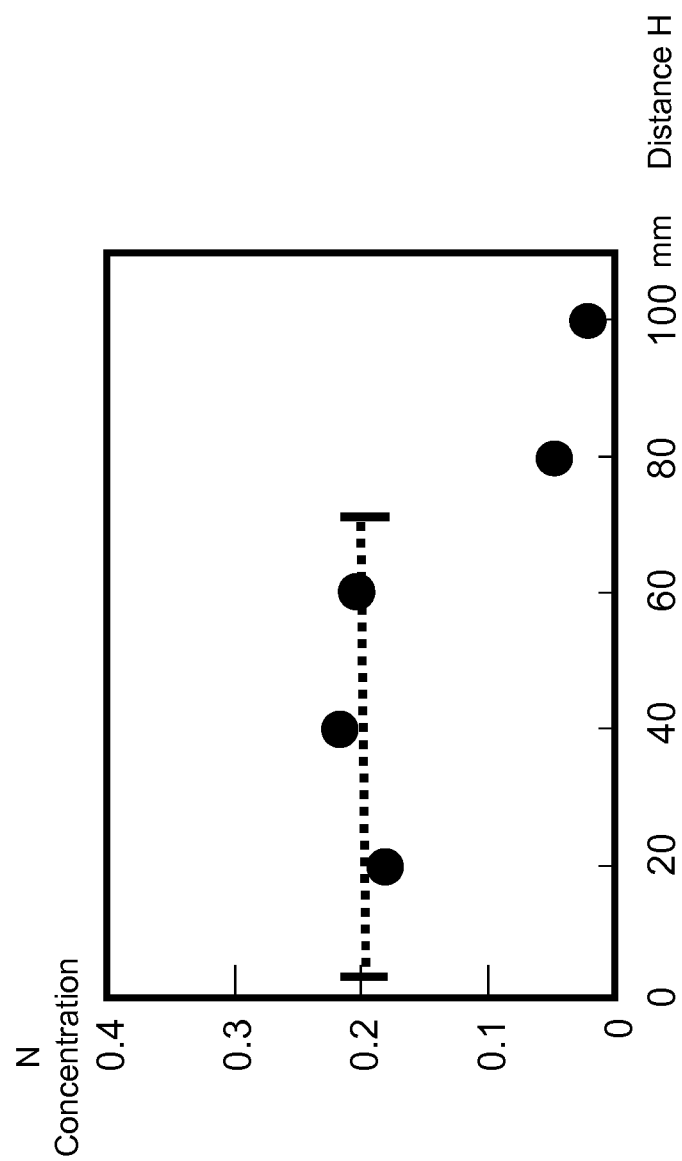
FIG. 5B is a graph illustrating concentration of nitrogen in a deposited layer in relation to a distance of a substrate from a plasma chamber.

FIG. 5B is a graph illustrating the concentration of nitrogen in a deposited layer in relation to a distance H of the substrate 120 from the plasma chamber 578. In the experiment of FIG. 5B, the substrate 120 was injected with Trimethylaluminium (TMA) and then injected with the radicals of a gas mixture including 50% of $N_2O$ and 50% of $NH_3$, thereby depositing atomic layer AlON on the substrate 120. As more nitrogen radicals (N*) remain active, more nitrogen atoms become incorporated into the deposited AlON layer. Hence, the content of nitrogen in the deposited layer is a function of the amount of active radicals that reach the surface of the substrate 120 in an active state. With increase in the distance H, the content of nitrogen in the deposited layer is decreased.

The decrease in the nitrogen content indicates that the nitrogen radicals N* are not effectively reaching the substrate 120. Referring to FIG. 5B, the content of nitrogen in the deposited layer drops significantly if the distance H increases to 80 mm or more. Therefore, it is advantageous to maintain the distance H to less than 80 mm when nitrogen radicals N* are used as reactant precursor.

For the purpose of experiment illustrated in FIG. 5B, the temperature of the substrate 120 was maintained at 80° C. and the temperature of the TMA gas canister was maintained at 5° C. The plasma was generated in the plasma chamber 578 by applying DC pulse of 120 kHz at 200 watts. The resulting deposition rate of AlON film was 1.70 Å/cycle.

Figure 6:
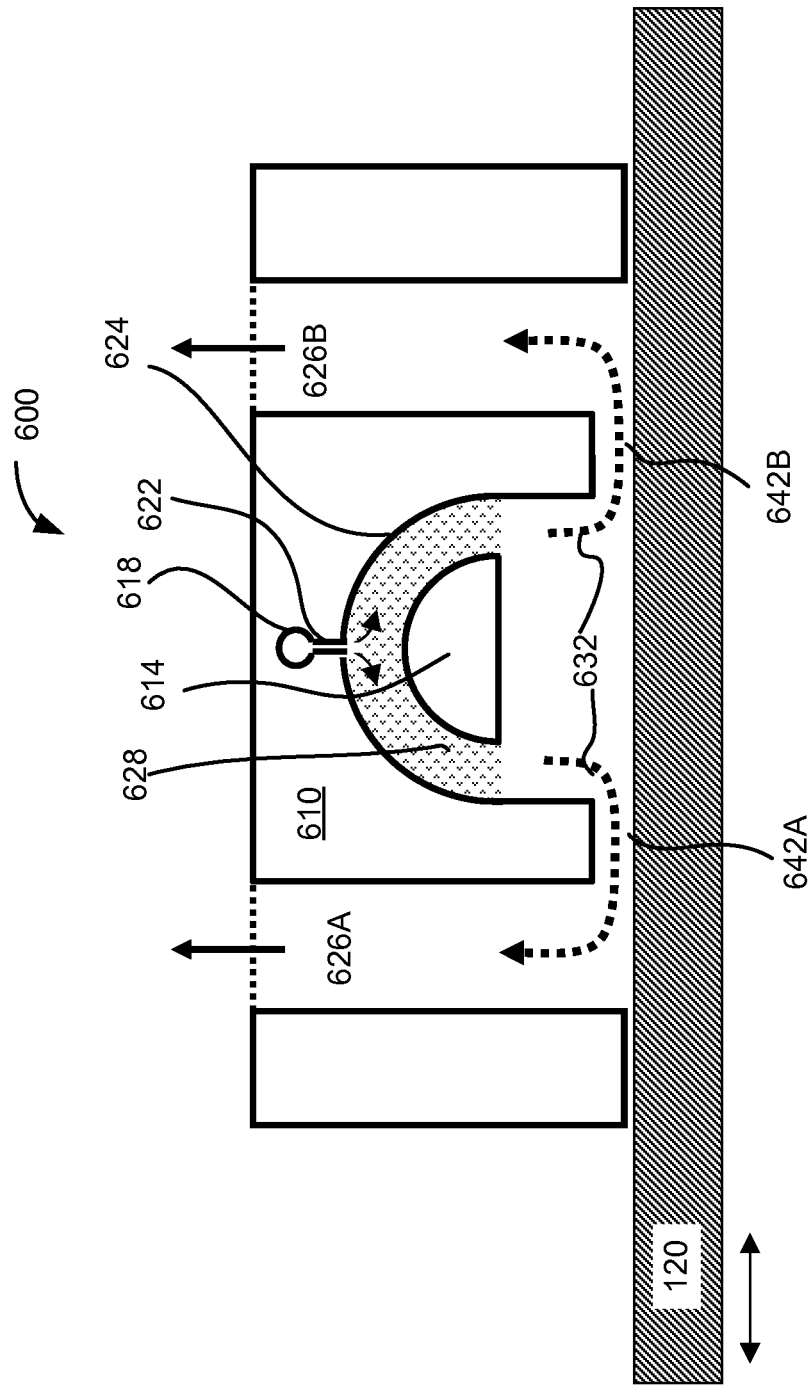
FIG. 6 is a cross sectional diagram illustrating a radical reactor, according to another embodiment.

FIG. 6 is a cross sectional diagram illustrating a radical reactor 600, according to another embodiment. The radical reactor 600 includes a body 610 and an inner electrode 614 extending across the radical reactor 600. The inner electrode has a semi-circular cross section where the flat surface faces the substrate 120 and the circular surface faces away from the substrate 120.

A gas or mixture of gases is injected into the radical reactor 600 via a channel 618 and perforations 622 formed in the body 610 of the radical reactor. Part 624 of the body 610 functions as an outer electrode. By applying the voltage between the inner electrode 614 and the outer electrode 624, radicals can be generated in a plasma region 628. The radicals flow into the exhaust portions 626A, 626B via constriction zones 642A, 642B. The principle and operation of depositing an atomic layer in the radical reactor 600 are substantially the same as the radical reactor 136B, and are omitted herein for the sake of brevity. Radical reactors of various other configurations may also be used.

When generating radicals of nitrogen, it is advantageous to use a mixture of gases instead of using a single gas. For example, based on experiments, radicals generated from a mixture of $N_2O$ gas and $NH_3$ gas resulted in a higher deposition rate compared to using only $N_2O$ gas or $NH_3$ gas. However, particles were formed at certain mixture ratio of gases. Hence, experiments were performed to identify a range of mixture ratio that resulted in a higher deposition rate while avoiding the formation of particles in the radical reactor 136B, as described below in detail with reference to Table 1.

In the following experiments, TMA was first injected on the substrate and then injected with radicals of gas(es) to form a film of AlN, $Al_2O_3$ or AlON. The temperature of the substrate was maintained at 80° C. and the temperature of TMA gas was maintained at 5° C. To generate radicals used as reactant precursor, $NH_3$, $N_2O$ or a mixture thereof was used. To generate the plasma, a voltage signal of 120 kHz at 200 watt was applied between the inner electrode 576 and the outer electrode 572. The distance H (See FIG. 5) between the substrate and the plasma chamber was 17 mm. The length of the radial reactor was 260 mm. The diameter of the susceptor holding the substrate was 80 cm and the rotation speed of the susceptor was 5 rpm.

The measured deposition rate of AlN, $Al_2O_3$ or AlON layer and characteristic of these layers are tabulated in Table 1. When $NH_3$ and $N_2O$ were injected into the radical reactor at a ratio of x (for $NH_3$ gas, where x takes a value between 0 and 1) to (1-x)(for N2O gas), the resulting layer was $Al_2O_3$ (when x=1), AlN (when x=0) or $(x)Al_2O_3+(1-x)AlN$.

TABLE 1

| $N_2O:NH_3$ | 0:100 | 10:90 | 20:80 | 30:70 | 40:60 | 50:50 | 60:40 | 70:30 | 80:20 | 90:10 | 100:0 |
|---|---|---|---|---|---|---|---|---|---|---|---|
| Refractive Index (n) | 1.559 | 1.632 | 1.629 | 1.626 | 1.629 | 1.632 | 1.626 | 1.615 | 1.607 | 1.621 | 1.637 |
| Dep. Rate (Å/cycle) | 0.44 | 1.48 | 1.57 | 1.68 | 1.35 | 1.70 | 1.81 | 1.88 | 1.96 | 1.91 | 1.31 |

TABLE 1-continued

| $N_2O:NH_3$ | 0:100 | 10:90 | 20:80 | 30:70 | 40:60 | 50:50 | 60:40 | 70:30 | 80:20 | 90:10 | 100:0 |
|---|---|---|---|---|---|---|---|---|---|---|---|
| Particle generated? | No | No | No | No | Yes | Yes | Yes | No | No | No | No |

As seen in Table 1, the deposition rate was greatest (1.96 Å/cycle) when the ratio between $N_2O$ gas and $NH_3$ gas was 80:20. At this ratio, no particle was generated in the radical reactor. When the $NH_3$ was increased or decreased beyond this ratio, the deposition rate decreased. Moreover, as the ratio of $NH_3$ increased to 40%, particles were formed in the radical reactor. Specifically, particles were detected in the radical reactor when ratio of $N_2O$ and $NH_3$ ranged from 40:60 to 60:40. The particles were not detected when the ratio of $NH_3$ increased to 70% and above. Table 1 shows that it is advantageous to use the radicals of nitrogen containing gas mixture instead of using only $N_2O$ or $NH_3$ to improve the deposition rate.

In another embodiment, Tetraethylmethylaminozirconium (TEMAZr) may be used as the source precursor and similar mixture of $(1-x)N_2O$ and $(x)NH_3$ (where x takes a value above 0 and below 0.5) may be used to generate radicals as the reactant precursor to generate a layer of $ZrO_{(1-x)}N_x$ on the substrate.

In still another embodiment, Trimethylsilane (TMS, $(CH_3)_3$ SiH) or Tridimethylaminesilicone (3DMAS) may be used as the source precursor and a gas of $(1-x)NH_3$ and $(x)N_2O$ (where x is above 0 and below 0.5) may be used to generate radicals acting as reactant precursor to obtain a layer of $SiO_xN_{(1-x)}$.

The mixture of gas for generating radicals is not limited to nitrogen containing gases. For example, $NH_3$ may be mixed with $CH_4$ to generate $N^*$ and $C^*$ radicals. In one embodiment, Tetraethylmethylaluminumtitanium (TEMATi) is used as the source precursor and radicals generated from $(1-x)NH_3$ and $(x)CH_4$ (where x is above 0 and below 50) are used as the reactant precursor to form a layer of $TiC_{(1-x)}N_x$ on a substrate.

In still another embodiment, $TiCl_4$ is used as the source precursor and radicals generated from $N_2$ or $NH_3$ gas are used as the reactant precursor to generate an atomic layer of TiN film on a substrate.

In the above embodiments, the distance H from the substrate to the plasma chamber may be set to be less than 80 mm so that most of the radicals may reach the substrate without reverting back to an inactive state.

Figure 7:
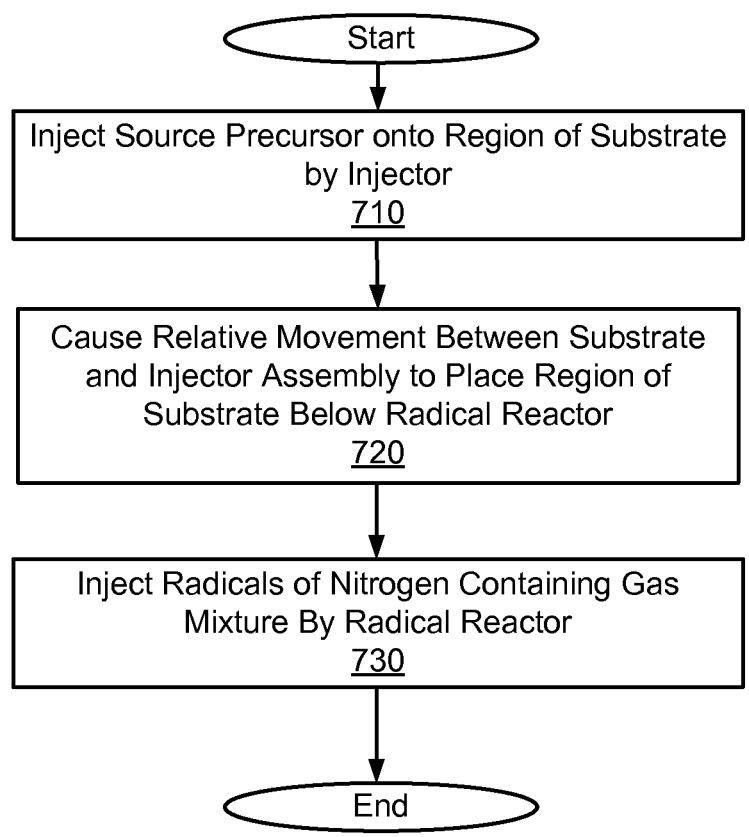
FIG. 7 is a flowchart illustrating a process of performing atomic layer depositing using radicals of nitrogen containing gas mixture, according to one embodiment.

FIG. 7 is a flowchart illustrating a process of performing atomic layer depositing using radicals of a nitrogen containing gas mixture, according to one embodiment. First, the source precursor is injected 710 onto a region of substrate by the injector 136A. Then, relative movement is caused 720 between the substrate 120 and the injector assembly 136 to place the region of substrate 120 below the radical reactor 720.

The radical reactor 136B is injected with a mixture of gas. The gas mixture may include a first gas and a second gas. The first gas may be $NH_3$ and the second gas may be $N_2O$. By using a mixture of two different gases, the deposition rate of the ALD process can be increased. In this example, the deposited layer is AlON.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A method of depositing a layer of material on a substrate, comprising:
   injecting a source precursor onto a substrate;
   injecting a mixture of $NH_3$ gas and $N_2O$ gas into a radical reactor, a ratio of $N_2O$ and $NH_3$ in the mixture being 70:30 to 90:10;
   generating radicals of the mixture in the radical reactor; and
   injecting the generated radicals onto the substrate, the generated radicals reacting with source precursor molecules or replacing the source precursor molecules to deposit a layer of material on the substrate.

2. The method of claim 1, wherein the deposited layer of material comprises aluminum oxynitride (AlON).

3. The method of claim 1, wherein the ratio of $N_2O$ and $NH_3$ is 80:20.

4. The method of claim 1, wherein generating the radicals comprises:
   injecting the mixture into a plasma chamber in the radical reactor; and
   applying a voltage across a first electrode in the plasma chamber and a second electrode surrounding the plasma chamber.

5. The method of claim 1, wherein a distance from the plasma chamber to the substrate is less than 80 mm.

6. The method of claim 1, wherein the source precursor is selected from a group consisting of Tetraethylmethylaminozirconium (TEMAZr), Trimethylsilane (TMS), Tridimethylaminesilicone (3DMAS) and Tetraethylmethylaluminumtitanium (TEMATi).

7. A method of depositing a layer of material on a substrate, comprising:
   injecting a source precursor onto a substrate;
   injecting a mixture of $NH_3$ gas and $CH_4$ gas into a radical reactor wherein more than half of the mixture is $NH_3$ gas;
   generating radicals of the mixture in the radical reactor; and
   injecting the generated radicals onto the substrate, the generated radicals reacting with source precursor molecules or replacing the source precursor molecules to deposit a layer of material on the substrate.

8. The method of claim 1, wherein the radical reactor is located remotely from the substrate.

9. The method of claim 7, wherein the radical reactor is located remotely from the substrate.

* * * * *